(12) United States Patent
Kim et al.

(10) Patent No.: US 9,140,986 B2
(45) Date of Patent: Sep. 22, 2015

(54) RESIST UNDERLAYER COMPOSITION AND PROCESS OF PRODUCING INTEGRATED CIRCUIT DEVICES USING THE SAME

(75) Inventors: Mi-Young Kim, Uiwang-si (KR); Sang-Kyun Kim, Uiwang-si (KR); Hyeon-Mo Cho, Uiwang-si (KR); Sang-Ran Koh, Uiwang-si (KR); Hui-Chan Yun, Uiwang-si (KR); Yong-Jin Chung, Uiwang-si (KR); Jong-Seob Kim, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 278 days.

(21) Appl. No.: 13/539,760

(22) Filed: Jul. 2, 2012

(65) Prior Publication Data

US 2012/0267766 A1    Oct. 25, 2012

Related U.S. Application Data

(63) Continuation of application No. PCT/KR2010/008849, filed on Dec. 10, 2010.

(30) Foreign Application Priority Data

Dec. 31, 2009 (KR) .................. 10-2009-0136179

(51) Int. Cl.
| | |
|---|---|
| *C08G 77/08* | (2006.01) |
| *G03F 7/075* | (2006.01) |
| *G03F 7/11* | (2006.01) |
| *H01L 21/02* | (2006.01) |
| *H01L 21/033* | (2006.01) |
| *C08L 83/04* | (2006.01) |
| *C08G 77/16* | (2006.01) |
| *C08G 77/18* | (2006.01) |
| *C08L 83/06* | (2006.01) |

(52) U.S. Cl.
CPC ............... *G03F 7/0752* (2013.01); *C08L 83/04* (2013.01); *G03F 7/11* (2013.01); *H01L 21/02126* (2013.01); *H01L 21/02216* (2013.01); *H01L 21/02282* (2013.01); *H01L 21/0332* (2013.01); *C08G 77/16* (2013.01); *C08G 77/18* (2013.01); *C08L 83/06* (2013.01)

(58) Field of Classification Search
CPC ........ C08G 77/16; C08G 77/18; C08L 83/06; H01L 21/02282; H01L 21/02216; H01L 21/02126; H01L 21/0332
See application file for complete search history.

(56) References Cited

U.S. PATENT DOCUMENTS

| | | | | |
|---|---|---|---|---|
| 6,147,156 | A | * 11/2000 | Yamaya et al. ............... | 524/806 |
| 7,514,199 | B2 | 4/2009 | Uh et al. | |
| 7,629,260 | B2 | 12/2009 | Uh et al. | |
| 2002/0120060 | A1 | * 8/2002 | Biteau et al. ................... | 524/755 |
| 2003/0003288 | A1 | 1/2003 | Nakata et al. | |
| 2004/0253461 | A1 | * 12/2004 | Ogihara et al. ............... | 428/447 |
| 2007/0087124 | A1 | * 4/2007 | Iwabuchi et al. ............. | 427/384 |
| 2007/0148586 | A1 | 6/2007 | Uh et al. | |
| 2007/0224816 | A1 | 9/2007 | Uh et al. | |
| 2008/0118875 | A1 | 5/2008 | Kim et al. | |
| 2008/0237615 | A1 | * 10/2008 | Lee et al. ......................... | 257/89 |
| 2008/0290472 | A1 | * 11/2008 | Yagihashi et al. ............. | 257/632 |
| 2009/0050020 | A1 | 2/2009 | Konno et al. | |
| 2009/0162782 | A1 | 6/2009 | Takei et al. | |
| 2010/0279509 | A1 | * 11/2010 | Kim et al. ..................... | 438/706 |
| 2012/0270143 | A1 | 10/2012 | Yun et al. | |

FOREIGN PATENT DOCUMENTS

| | | |
|---|---|---|
| CN | 1376740 A | 10/2002 |
| CN | 101042533 A | 9/2007 |
| CN | 101133364 A | 2/2008 |
| CN | 101322074 A | 12/2008 |
| CN | 101370854 A | 2/2009 |
| CN | 101490621 A | 7/2009 |
| CN | 102713757 A | 10/2012 |
| JP | 2004-059738 A | 2/2004 |
| KR | 10-0725795 B1 | 5/2007 |
| KR | 10 2007-0095736 A | 10/2007 |
| KR | 10 2007-0122250 A | 12/2007 |
| KR | 10-0796047 B1 | 1/2008 |
| KR | 2009/077618 | * 7/2009 |
| TW | 200940651 A1 | 10/2009 |

OTHER PUBLICATIONS

Taiwanese Search Report in TW 099145501, dated Apr. 17, 2013 (Kim, et al.).
International Search Report in PCT/KR2010/008849, dated Aug. 12, 2011 (Kim, et al.).
Chinese Search Report in CN 2010080060221.8, dated Mar. 5, 2013, with English Translation (Kim, et al.).

* cited by examiner

*Primary Examiner* — Margaret Moore
(74) *Attorney, Agent, or Firm* — Lee & Morse, P.C.

(57) ABSTRACT

A resist underlayer composition includes a solvent and an organosilane condensation polymerization product, the organosilane condensation polymerization product including about 40 to about 80 mol % of a structural unit represented by the following Chemical Formula 1,

[Chemical Formula 1]

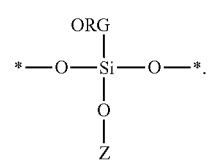

11 Claims, 1 Drawing Sheet

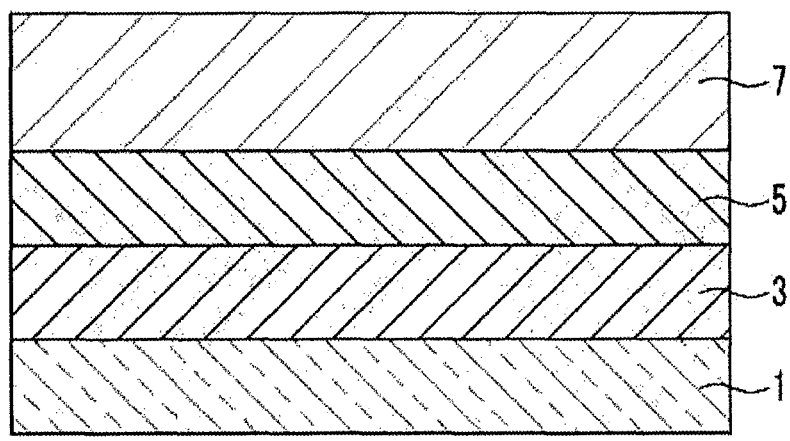

RESIST UNDERLAYER COMPOSITION AND PROCESS OF PRODUCING INTEGRATED CIRCUIT DEVICES USING THE SAME

CROSS-REFERENCE TO RELATED APPLICATIONS

This application is a continuation of pending International Application No. PCT/KR2010/008849, entitled "RESIST UNDERLAYER COMPOSITION AND PROCESS OF PRODUCING INTEGRATED CIRCUIT DEVICES USING THE SAME," which was filed on Dec. 10, 2010, the entire contents of which are hereby incorporated by reference for all purposes.

This application claims priority under 35 USC §119 to Korean Patent Application No. 10-2009-0136179, filed on Dec. 31, 2009, the entire contents of which are hereby incorporated by reference for all purposes.

BACKGROUND

1. Field

Embodiments relate to a resist underlayer composition and a process of producing an integrated circuit device using the same.

2. Background

Generally, a lithography process should minimize reflection between a resist layer and a substrate in order to increase resolution of the lithography process. For this reason, an anti-reflective coating (ARC) material may be used between the resist layer and the substrate to increase resolution. However, the anti-reflective coating material may have a basic composition that is similar to the resist material, and thus an etchant of the anti-reflective coating material may exhibit a poor etch selectivity relative to the resist layer. Therefore, an additional lithography process may be required in the subsequent etching process. However, a general resist material may not have sufficient etching resistance against the subsequent etching process.

SUMMARY

Embodiments are directed to a resist underlayer composition, including a solvent, and an organosilane condensation polymerization product, the organosilane condensation polymerization product including about 40 to about 80 mol % of a structural unit represented by the following Chemical Formula 1,

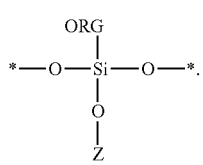
[Chemical Formula 1]

In Chemical Formula 1,

ORG may be selected from the group of:
a C6 to C30 functional group including a substituted or unsubstituted aromatic ring,
a C1 to C12 alkyl group, and
—Y—{Si(OR)$_3$}$_a$, wherein Y is a linear or branched substituted or unsubstituted C1 to C20 alkylene group, a C1 to C20 alkylene group including, in a main chain of the alkylene group, a group selected from the group of an alkenylene group, an alkynylene group, an arylene group, a heterocyclic group, a urea group, an isocyanurate group, and a combination thereof, or a substituted or unsubstituted C6 to C30 arylene group, R is a C1 to C6 alkyl group or a silicon containing group, and a is 1 or 2, and Z may be selected from the group of hydrogen and a C1 to C6 alkyl group.

The organosilane condensation polymerization product may further include at least one of: a structural unit represented by the following Chemical Formula 2, and a structural unit represented by the following Chemical Formula 3:

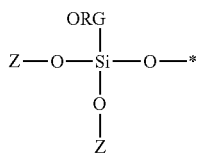
[Chemical Formula 2]

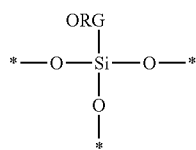
[Chemical Formula 3]

In Chemical Formulae 2 and 3,

ORG may be independently selected from the group of:
a C6 to C30 functional group including a substituted or unsubstituted aromatic ring,
a C1 to C12 alkyl group, and
—Y—{Si(OR)$_3$}$_a$, wherein Y is a linear or branched substituted or unsubstituted C1 to C20 alkylene group, a C1 to C20 alkylene group including, in a main chain of the alkylene group, a group selected from the group of an alkenylene group, an alkynylene group, an arylene group, a heterocyclic group, a urea group, an isocyanurate group, and a combination thereof, or a substituted or unsubstituted C6 to C30 arylene group, R is a C1 to C6 alkyl group or a silicon containing group, and a is 1 or 2, and Z may be selected from the group of hydrogen and a C1 to C6 alkyl group.

The organosilane condensation polymerization product may be produced from a compound represented by the following Chemical Formula 4 and a compound represented by the following Chemical Formula 5 under acid or base catalysis:

[R$^1$O]$_3$Si—X  [Chemical Formula 4]

[R$^2$O]$_3$Si—R$^3$  [Chemical Formula 5]

In Chemical Formulae 4 and 5,

R$^1$ and R$^2$ may each independently be a C1 to C6 alkyl group,

R$^3$ may be a C1 to C12 alkyl group, and

X may be a C6 to C30 functional group including a substituted or unsubstituted aromatic ring.

The organosilane condensation polymerization product may be produced from a compound represented by the following Chemical Formula 4, a compound represented by the following Chemical Formula 5, and a compound represented by the following Chemical Formula 6 under acid or base catalysis:

$$[R^1O]_3Si\text{—}X \qquad \text{[Chemical Formula 4]}$$

$$[R^2O]_3Si\text{—}R^3 \qquad \text{[Chemical Formula 5]}$$

$$\{[R^4O]_3Si\}_n\text{—}Y \qquad \text{[Chemical Formula 6]}$$

In Chemical Formulae 4, 5, and 6, $R^1$, $R^2$, and $R^4$ may each independently be a C1 to C6 alkyl group, $R^3$ may be a C1 to C12 alkyl group, X may be a C6 to C30 functional group including a substituted or unsubstituted aromatic ring, and Y may be a linear or branched substituted or unsubstituted C1 to C20 alkylene group, or a C1 to C20 alkylene group including, in a main chain of the alkylene group, a group selected from the group of an alkenylene group, an alkynylene group, an arylene group, a heterocyclic group, a urea group, an isocyanurate group, and a combination thereof, or a substituted or unsubstituted C6 to C30 arylene group, and n may be 2 or 3.

ORG may be the C6 to C30 functional group including a substituted or unsubstituted aromatic ring, and the C6 to C30 functional group including a substituted or unsubstituted aromatic ring may be represented by the following Chemical Formula 21:

$$*\text{-}(L)_m\text{-}X^1 \qquad \text{[Chemical Formula 21]}$$

In Chemical Formula 21,

L may be a linear or branched substituted or unsubstituted C1 to C20 alkylene group, wherein one or more carbons of the alkylene group are optionally substituted with a functional group selected from the group of an ether group (—O—), a carbonyl group (—CO—), an ester group (—COO—), and an amine group (—NH—), $X^1$ may be selected from the group of a substituted or unsubstituted C6 to C20 aryl group, a substituted or unsubstituted C7 to C20 arylcarbonyl group, and a substituted or unsubstituted C9 to C20 chromone group, and m may be 0 or 1.

ORG may be the C1 to C12 alkyl group.

ORG may be the —Y—$\{Si(OR)_3\}_a$.

The organosilane condensation polymerization product may be included in an amount of about 1 to about 50 wt % based on a total amount of the resist underlayer composition.

The resist underlayer composition may further include an additive selected from the group of a cross-linking agent, a radical stabilizer, a surfactant, and a combination thereof.

The resist underlayer composition may further include an additive selected from the group of pyridinium p-toluene sulfonate, amidosulfobetain-16, ammonium(−)-camphor-10-sulfonic acid ammonium salt, ammonium formate, alkyltriethylammonium formate, pyridinium formate, tetrabutyl ammonium acetate, tetrabutyl ammonium azide, tetrabutyl ammonium benzoate, tetrabutyl ammonium bisulfate, tetrabutyl ammonium bromide, tetrabutyl ammonium chloride, tetrabutyl ammonium cyanide, tetrabutyl ammonium fluoride, tetrabutyl ammonium iodide, tetrabutyl ammonium sulfate, tetrabutyl ammonium nitrate, tetrabutyl ammonium nitrite, tetrabutyl ammonium p-toluene sulfonate, tetrabutyl ammonium phosphate, and a combination thereof.

Embodiments are also directed to a method of manufacturing a semiconductor integrated circuit device, the method including providing a material layer on a substrate, forming a first resist underlayer on the material layer, coating the resist underlayer composition according to an embodiment on the first resist underlayer to form a second resist underlayer, forming a radiation-sensitive imaging layer on the second underlayer, patternwise exposing the radiation-sensitive imaging layer to radiation to form a pattern of radiation-exposed regions in the imaging layer, selectively removing portions of the radiation-sensitive imaging layer and the second resist underlayer to expose portions of the first resist underlayer, selectively removing portions of the patterned second resist underlayer and portions of the first resist underlayer to expose portions of the material layer, and etching the exposed portions of the material layer to pattern the material layer.

The method may further include, between the processes of forming the second resist underlayer and forming the radiation-sensitive imaging layer, forming an anti-reflection coating.

Embodiments are also directed to a semiconductor integrated circuit device manufactured using the method according to an embodiment.

BRIEF DESCRIPTION OF THE DRAWING

Features will become apparent to those of skill in the art by describing in detail exemplary embodiments with reference to the attached drawing in which:

FIG. 1 illustrates a cross-sectional view of a multi-layer formed by sequentially stacking a first resist underlayer, a second resist underlayer, and a resist layer on a substrate.

| <Description of Reference Numerals Indicating Primary Elements in the Drawing> | |
|---|---|
| 1: substrate | 3: first resist underlayer |
| 5: second resist underlayer | 7: resist layer. |

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing, dimensions may be exaggerated for clarity of illustration. It will be understood that when an element is referred to as being "on" another element, it can be directly on the other element, or one or more intervening elements may also be present. It will also be understood that when an element is referred to as being "under" another element, it can be directly under, or one or more intervening elements may also be present. It will also be understood that when an element is referred to as being "between" two elements, it can be the only element between the two elements, or one or more intervening elements may also be present. Like reference numerals refer to like elements throughout.

As used herein, when specific definition is not otherwise provided, the term "substituted" refers to one substituted with a C1 to C6 alkyl group or a C6 to C12 aryl group.

As used herein, when specific definition is not otherwise provided, the term "alkyl" refers to a C1 to C6 alkyl; the term "alkylene" refers to C1 to C6 alkylene; the term "an aryl" refers to a C6 to C12 aryl; the term "arylene" refers to a C6 to C12 arylene; the term "alkenyl" refers to a C2 to C6 alkenyl; the term "alkenylene" refers to a C2 to C6 alkenylene; the term "alkynyl" refers to a C2 to C6 alkynyl; and the term "alkynylene" refers to a C2 to C6 alkynylene.

As used herein, when specific definition is not otherwise provided, the term "heterocyclic group" refers to a C3 to C12 heteroarylene group, a C1 to C12 heterocycloalkylene group, a C2 to C12 heterocycloalkenylene group, a C2 to C12 heterocycloalkynylene group, or a fused ring thereof; and includes a heteroatom of N, O, S, or P in a ring. The heterocyclic group includes 1 to 5 heteroatoms.

According to an example embodiment, a resist underlayer composition includes an organosilane condensation polymerization product that includes a solvent as well as about 40 to about 80 mol % of the structural unit represented by the following Chemical Formula 1.

[Chemical Formula 1]

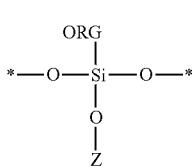

In an embodiment, ORG in Chemical Formula 1 may be selected from the group of a C6 to C30 functional group including a substituted or unsubstituted aromatic ring, a C1 to C12 alkyl group, and —Y—{Si(OR)$_3$}$_a$. In —Y—{Si(OR)$_3$}$_a$, R may be a C1 to C6 alkyl group or a silicon containing group. In —Y—{Si(OR)$_3$}$_a$, Y may be a linear or branched substituted or unsubstituted C1 to C20 alkylene group. In —Y—{Si(OR)$_3$}$_a$, Y may be a C1 to C20 alkylene group including, in a main chain of the alkylene, a group selected from the group of an alkenylene group, an alkynylene group, an arylene group, a heterocyclic group, a urea group, an isocyanurate group, and a combination thereof. Y may be a substituted or unsubstituted C6 to C30 arylene group. In —Y—{Si(OR)$_3$}$_a$, a may be 1 or 2.

In an embodiment, Z in Chemical Formula 1 may be selected from the group of hydrogen and a C1 to C6 alkyl group.

The structural unit represented by the following Chemical Formula 1 may be included within the above range, considering improvement of storage stability, and etching resistance. In particular, a resist underlayer composition according to an embodiment may provide excellent etching resistance against O$_2$ gas in a plasma state.

In an example embodiment, the organosilane condensation polymerization product may further include a structural unit represented by the following Chemical Formula 2 or 3.

[Chemical Formula 2]

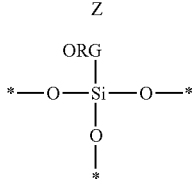

[Chemical Formula 3]

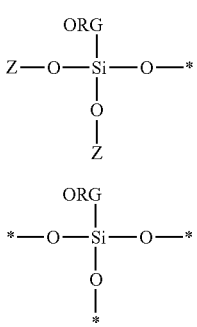

In an embodiment, ORG in Chemical Formulae 2 and 3 may be the same or different from ORG in Chemical Formula 1. ORG in Chemical Formulae 2 and 3 may each independently be selected from the group of a C6 to C30 functional group including a substituted or unsubstituted aromatic ring, a C1 to C12 alkyl group, and —Y—{Si(OR)$_3$}$_a$. R may be a C1 to C6 alkyl group or a silicon containing group, and Y may be a linear or branched substituted or unsubstituted C1 to C20 alkylene group or a C1 to C20 alkylene group including, in a main chain of the alkylene, a group selected from the group of an alkenylene group, an alkynylene group, an arylene group, a heterocyclic group, a urea group, an isocyanurate group, and a combination thereof, or a substituted or unsubstituted C6 to C30 arylene group, and a may be 1 or 2. Z in Chemical Formula 2 may be the same or different from Z in Chemical Formula 1, and may be selected from the group of hydrogen and a C1 to C6 alkyl group.

The structural unit represented by the above Chemical Formula 2 may be included in an amount of about 1 to about 20 mol % considering storage stability, and the structural unit represented by the above Chemical Formula 3 may be included in an amount of about 10 to about 50 mol % considering improvement of etching resistance for oxygen plasma.

The organosilane condensation polymerization product may be produced using the compounds represented by the following Chemical Formulae 4 and 5 under acid or base catalysis.

[R$^1$O]$_3$Si—X     [Chemical Formula 4]

[R$^2$O]$_3$Si—R$^3$     [Chemical Formula 5]

In Chemical Formulae 4 and 5,
R$^1$ and R$^2$ may each independently be a C1 to C6 alkyl group,
R$^3$ may be a C1 to C12 alkyl group, and
X may be a C6 to C30 functional group including a substituted or unsubstituted aromatic ring.

The compounds represented by Chemical Formulae 4 and 5 may be mixed at a weight ratio of about 1:0.005 to about 1:3, and the resist underlayer composition according to an example embodiment may provide improved absorbance, storage stability, and etching resistance. In particular, a compound represented by the above Chemical Formula 4 may effectively improve absorbance and etching resistance. A compound represented by the above Chemical Formula 5 may effectively improve absorbance and storage stability. Accordingly, they may be included within the ranges.

The organosilane condensation polymerization product may be produced from the compounds represented by the following Chemical Formulae 4 to 6 under acid or base catalysis.

[R$^1$O]$_3$Si—X     [Chemical Formula 4]

[R$^2$O]$_3$Si—R$^3$     [Chemical Formula 5]

{[R$^4$O]$_3$Si}$_n$—Y     [Chemical Formula 6]

In Chemical Formulae 4 to 6,
R$^1$, R$^2$, and R$^4$ may each independently be a C1 to C6 alkyl group,
R$^3$ may be a C1 to C12 alkyl group,
X may be a C6 to C30 functional group including a substituted or unsubstituted aromatic ring,
Y may be a linear or branched substituted or unsubstituted C1 to C20 alkylene group, or a C1 to C20 alkylene group including a substituent selected from the group of an alkenylene group, an alkynylene group, an arylene group, a heterocyclic group, a urea group, an isocyanurate group, and a combination thereof, in the main chain, or a substituted or unsubstituted C6 to C30 arylene group, and n may be 2 or 3.

The compounds represented by the above Chemical Formulae 4 to 6 may be respectively included at a weight ratio of about 1:0 to about 1:20 to improve absorbance, storage stability, and etching resistance of a resist underlayer composition according to an embodiment. In addition, a compound represented by the above Chemical Formula 6 may effectively improve etching resistance and storage stability. Thus, it may be included within the range. In addition, the compound represented by the above Chemical Formula 6 may apply a hydrophilic effect to a thin film. Accordingly, it may improve interface affinity with an anti-reflection coating layer.

More specifically, the compound represented by the above Chemical Formula 6 may be the compounds represented by the following Chemical Formulae 7 to 20.

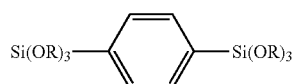

[Chemical Formula 7]

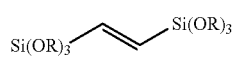

[Chemical Formula 8]

[Chemical Formula 9]

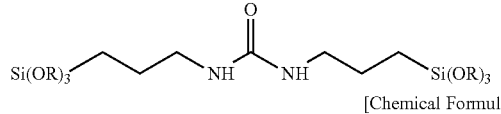

[Chemical Formula 10]

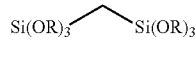

[Chemical Formula 11]

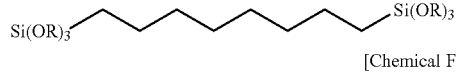

[Chemical Formula 12]

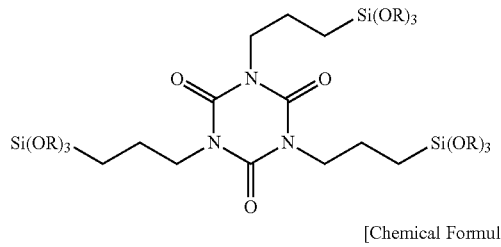

[Chemical Formula 13]

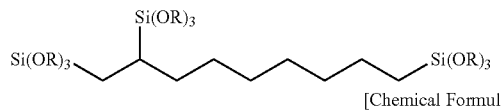

[Chemical Formula 14]

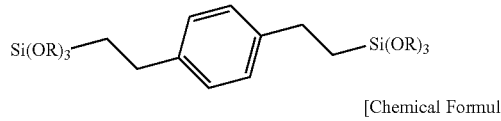

[Chemical Formula 15]

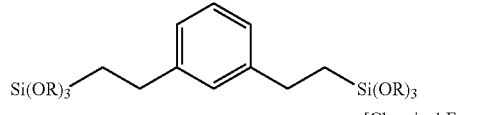

[Chemical Formula 16]

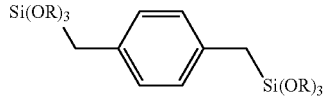

[Chemical Formula 17]

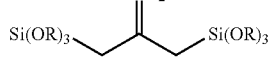

[Chemical Formula 18]

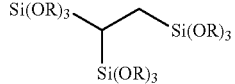

[Chemical Formula 19]

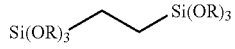

[Chemical Formula 20]

In Chemical Formulae 7 to 20, each R may be independently a C1 to C6 alkyl group.

In the above Chemical Formulae, the "C6 to C30 functional group including a substituted or unsubstituted aromatic ring" may be represented by the following Chemical Formula 21.

$$*-(L)_m-X^1$$ [Chemical Formula 21]

In Chemical Formula 21,

L may be a linear or branched substituted or unsubstituted C1 to C20 alkylene group, wherein one or two or more carbons of the alkylene group are optionally unsubstituted or substituted with a functional group selected from the group of an ether group (—O—), a carbonyl group (—CO—), an ester group (—COO—), an amine group (—NH—), and a combination thereof, $X^1$ may be selected from the group of a substituted or unsubstituted C6 to C20 aryl group, a substituted or unsubstituted C7 to C20 arylcarbonyl group, and a substituted or unsubstituted C9 to C20 chromone group, and m may be 0 or 1.

Herein, in Chemical Formula 21, the term "substituted" refers to one substituted with a substituent selected from the group of a halogen, a hydroxy group, a nitro group, a C1 to C6 alkyl group, C1 to C6 haloalkyl group, a C1 to C6 alkoxy group, a C2 to C6 alkenyl group, a C6 to C12 aryl group, and a C6 to C12 arylketone group.

More specifically, in the above Chemical Formula, the "C6 to C30 functional group including a substituted or unsubstituted aromatic ring" may be represented by the following Chemical Formulae 22 to 42.

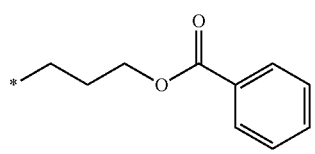

[Chemical Formula 22]

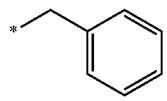

[Chemical Formula 23]

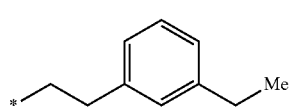

[Chemical Formula 24]

-continued

[Chemical Formula 25]
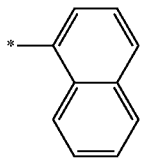

[Chemical Formula 26]
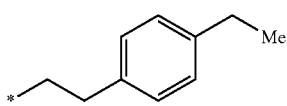

[Chemical Formula 27]
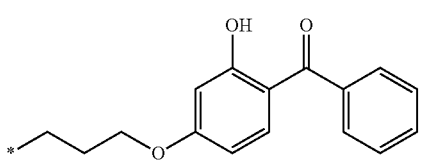

[Chemical Formula 28]
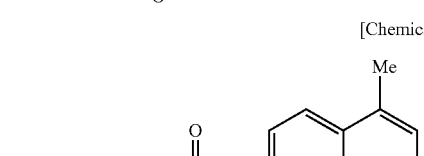

[Chemical Formula 29]
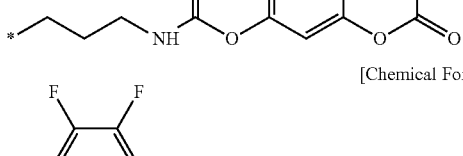

[Chemical Formula 30]
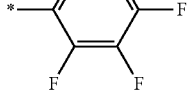

[Chemical Formula 31]
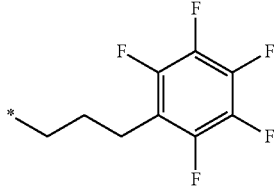

[Chemical Formula 32]
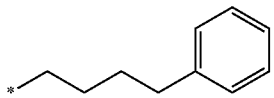

[Chemical Formula 33]
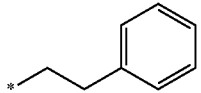

[Chemical Formula 34]
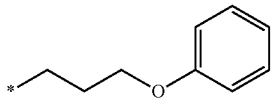

-continued

[Chemical Formula 35]
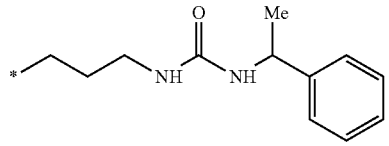

[Chemical Formula 36]
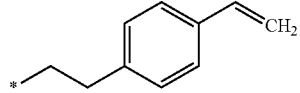

[Chemical Formula 37]
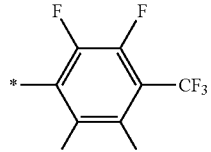

[Chemical Formula 38]
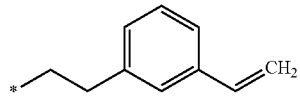

[Chemical Formula 39]

[Chemical Formula 40]
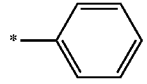

[Chemical Formula 41]
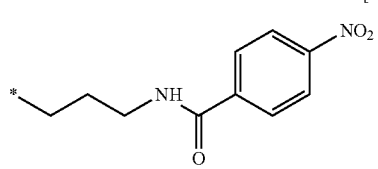

[Chemical Formula 42]
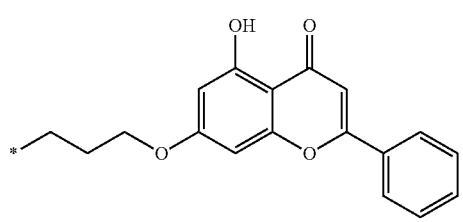

The organosilane condensation polymerization product may be produced through a hydrolysis and/or condensation polymerization reaction under an acid or base catalyst.

The acid catalyst or base catalyst may facilitate the acquisition of the organosilane condensation polymerization product having a desired molecular weight by properly controlling the speed of a hydrolysis reaction or a condensation polymerization reaction of the above Chemical Formulae. The kinds of the acid and base catalysts may be suitably selected. In an embodiment, the acid catalyst may be selected from the group of hydrofluoric acid, hydrochloric acid, bromic acid, iodic acid, nitric acid, sulfuric acid, p-toluenesulfonic acid monohydrate, diethylsulfate, 2,4,4,6-tetrabromocyclohexadienone, benzoin tosylate, 2-nitrobenzyl tosylate, alkyl esters of organic sulfonic acids, and a combination thereof. The base catalyst may be selected from the group of an alkylamine such as triethylamine and diethylamine, ammonia, sodium hydroxide, potassium hydroxide, pyridine, and a combination thereof. In an implementation, the acid catalyst or the base catalyst may be used in an amount of about 0.001 to about 5 parts by weight based on 100 parts by weight of the entire weight of compounds producing the organosilane condensation polymerization product in order to acquire a condensation polymerization product of a desired molecular weight by properly controlling a reaction rate.

In an embodiment, the organosilane condensation polymerization product may be included in an amount of about 1 to about 50 wt % based on the total amount of the resist underlayer composition. The organosilane condensation polymerization product may be included within the range considering coating capability of an underlayer composition according to an embodiment.

The resist underlayer composition according to an example embodiment includes the organosilane condensation polymerization product and a solvent. The solvent may help prevent voids, and may dry a film slowly to thereby improve planarization properties. The kind of the solvent may be suitably selected. In an embodiment, the solvent has a high boiling point that volatilizes at a temperature slightly lower than a temperature at which the resist underlayer composition according to an embodiment is coating, dried, and solidified. Examples of the solvent may include acetone, tetrahydrofuran, benzene, toluene, diethyl ether, chloroform, dichloromethane, ethyl acetate, propylene glycol methyl ether, propylene glycol ethyl ether, propylene glycol propyl ether, propylene glycol methyl ether acetate, propylene glycol ethyl ether acetate, propylene glycol propyl ether acetate, ethyl lactate, g-butyrolactone, methyl isobutyl ketone, or a combination thereof.

The resist underlayer composition according to an embodiment may further include an additive selected from the group of a cross-linking agent, a radical stabilizer, a surfactant, and a combination thereof.

The resist underlayer composition may include an additive selected from the group of pyridinium p-toluene sulfonate, amidosulfobetain-16, ammonium(-)-camphor-10-sulfonic acid ammonium salt, ammonium formate, alkyltriethylammonium formate, pyridinium formate, tetrabutyl ammonium acetate, tetrabutyl ammonium azide, tetrabutyl ammonium benzoate, tetrabutyl ammonium bisulfate, tetrabutyl ammonium bromide, tetrabutyl ammonium chloride, tetrabutyl ammonium cyanide, tetrabutyl ammonium fluoride, tetrabutyl ammonium iodide, tetrabutyl ammonium sulfate, tetrabutyl ammonium nitrate, tetrabutyl ammonium nitrite, tetrabutyl ammonium p-toluene sulfonate, tetrabutyl ammonium phosphate, and a combination thereof. These additives may be included in an amount of 0.0001 to about 0.01 parts by weight based on 100 parts by weight of an organosilane condensation polymerization product to improve etching resistance, solvent resistance, and storage stability of a resist underlayer composition according to an embodiment.

A resist underlayer according to an embodiment may be generally formed as shown in FIG. 1. For example, a first resist underlayer 3, which may be formed of an organic material, may be formed on a substrate 1 (which may be formed of, e.g., a silicon oxide layer), and a second resist underlayer 5 may be formed on the first resist underlayer 3. The second resist underlayer 5 may be formed using the resist underlayer composition according to an embodiment. Then, a resist layer 7 may be formed on the second resist underlayer 5. The second resist underlayer 5 may have a higher etch selectivity with respect to the resist layer 7 than the substrate 1. Thus, a pattern may be easily transferred even when a thin resist layer 7 is used. The first resist underlayer 3 may be etched, and the pattern may be transferred by using the second resist underlayer 5 (with a pattern transferred thereto) as a mask, and then the pattern may be transferred to the substrate 1 by using the first resist underlayer 3 as a mask. Thus, a substrate may be etched to a desired depth while using a thinner resist layer 7.

According to another embodiment, a method of manufacturing a semiconductor integrated circuit device is provided. The method may include (a) providing a material layer on a substrate; (b) forming a first resist underlayer on the material layer; (c) coating the resist underlayer composition according to an embodiment on the first resist underlayer to form a second resist underlayer; (d) forming a radiation-sensitive imaging layer on the second underlayer; (e) patternwise exposing the radiation-sensitive imaging layer to radiation to form a pattern of radiation-exposed regions in the imaging layer; (f) selectively removing portions of the radiation-sensitive imaging layer and the second resist underlayer to expose portions of the first resist underlayer; (g) selectively removing patterned second resist underlayer and portions of the first resist underlayer to expose portions of the material layer; and (h) etching the exposed portions of the material layer to pattern the material layer.

The method may further include forming an anti-reflection coating between the processes of forming the second resist underlayer (c) and forming a radiation-sensitive imaging layer.

A method of forming a patterned material layer may be carried out in accordance with the following procedure.

First, a material (e.g., aluminum or silicon nitride (SiN)) to be patterned may be applied to a substrate, e.g., a silicon substrate, by a suitable technique. The material to be patterned may be electrically conductive, semi-conductive, magnetic, insulating, etc.

The first resist underlayer including an organic material may be provided on the patterned material. The first resist underlayer may include an organic material including carbon, hydrogen, oxygen, and the like at a thickness of about 200 Å to about 12000 Å. In other implementations, the first resist underlayer may be formed to various thicknesses using various materials.

Thereafter, the resist underlayer composition according to an embodiment may be spin-coated to a thickness of about 500 Å to about 4000 Å and baked at about 100° C. to about 300° C. for about 10 seconds to about 10 minutes to form the second resist underlayer. The thickness, baking temperature, and baking time may be set to various suitable thicknesses, baking temperature, and baking times.

The radiation-sensitive imaging layer may be formed on the second resist underlayer. Light exposure and development may be performed to form a pattern on the imaging layer. The imaging layer and antireflective layer may be selectively removed to expose portions of the material layer, and dry etching may be performed using an etching gas. Examples of the etching gas include $CHF_3$, $CF_4$, $CH_4$, $Cl_2$, $BCl_3$, $CH_2F_2$, $CHF_3$, $CF_4$, $C_2F_6$, and a mixed gas. After forming a patterned material layer, any remaining material may be removed using a general photoresist stripper.

According to another embodiment, a semiconductor integrated circuit device formed using the method is provided. Particularly, a method according to an embodiment described herein may be applied to areas like a patterned material layer structure such as metal wiring line, holes for contact or bias; an insulation section such as a multi-mask trench or shallow trench insulation; and a trench for a capacitor structure such as designed in an integrated circuit device. In addition, the method may be applied to formation of a patterned layer of oxide, nitride, polysilicon, and chromium. Embodiments may be applied to various lithographic methods and device structures.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

COMPARATIVE EXAMPLE 1

3000 g of methyltrimethoxysilane (MTMS) was dissolved in 7000 g of propylene glycol monomethyl ether acetate (PGMEA) in 10 l 4-necked flask including a mechanical agitator, a condenser, a dropping funnel, and a nitrogen gas injection tube, and 833.4 g of a 0.5% nitric acid aqueous solution was added thereto. Then, the solution mixture was hydrolyzed at 50° C. for 1 hour and applied with a negative pressure to remove methanol produced therein. The resulting product was reacted at 50° C. for 4 days. After the reaction, an organosilane condensation polymerization product (weight average molecular weight=20000, polydispersity (PD)=4.5) was obtained.

Hexane was added to the organosilane condensation polymerization product to precipitate a polymer as a sample. 100 g of methylisobutylketone (MIBK) was added to 2.0 g of the sample to a diluted solution. The diluted solution was mixed with 0.5 g of pyridinium p-toluene sulfonate, preparing a resist underlayer composition.

The resist underlayer composition was spin-coated on a silicon wafer and baked at 240° C. for 1 minute to provide a 1000 Å-thick resist underlayer.

EXAMPLE 1

457.44 g of phenyltrimethoxysilane and 2542.56 g of methyltrimethoxysilane was dissolved 7000 g of PGMEA in a 10 l 4-necked flask including a mechanical agitator, a condenser, a dropping funnel, and a nitrogen gas injection tube, and 793.62 g of 0.5% nitric acid aqueous solution was added thereto. Then, the solution mixture was hydrolyzed at 50° C. for 1 hour and applied with a negative pressure to remove methanol produced therein. The resulting product was reacted at 50° C. for 7 days. After the reaction, an organosilane condensation polymerization product (weight average molecular weight=20000, polydispersity (PD)=4.5) was obtained.

Hexane was added to the organosilane condensation polymerization product to precipitate a polymer as a sample. 100 g of methylisobutylketone (MIBK) was added to 2.0 g of the sample to obtain a diluted solution. The diluted solution was mixed with 0.5 g of pyridinium p-toluene sulfonate, preparing a resist underlayer composition.

The resist underlayer composition was spin-coated on a silicon wafer and baked at 240° C. for 1 minute to provide a 1000 Å-thick resist underlayer.

EXAMPLE 2

457.44 g of phenyltrimethoxysilane and 2542.56 g of methyltrimethoxysilane was dissolved in 7000 g of PGMEA and 1190.44 g of ethanol in a 10 l 4-necked flask including a mechanical agitator, a condenser, a dropping funnel, and a nitrogen gas injection tube, and 793.62 g of 0.5% nitric acid aqueous solution was added thereto. Then, the solution mixture was hydrolyzed at 50° C. for 1 hour and applied with a negative pressure to remove methanol and ethanol produced therein. The resulting product was reacted at 50° C. for 7 days. After the reaction, an organosilane condensation polymerization product (weight average molecular weight=20000, polydispersity (PD)=4.45) was obtained.

Hexane was added to the organosilane condensation polymerization product to precipitate a polymer as a sample. 100 g of methylisobutylketone (MIBK) was added to 2.0 g of the sample to a diluted solution. The diluted solution was mixed with 0.5 g of pyridinium p-toluene sulfonate, preparing a resist underlayer composition.

The resist underlayer composition was spin-coated on a silicon wafer and baked at 240° C. for 1 minute to provide a 1000 Å-thick resist underlayer.

EXAMPLE 3

132.4 g of phenyltrimethoxysilane, 363.82 g of methyltrimethoxysilane, and 1183.78 g of bistriethoxysilylethane were dissolved in 3920 g of PGMEA in a 10 l 4-necked flask including a mechanical agitator, a condenser, a dropping funnel, and a nitrogen gas injection tube, and 379 g of a 0.5% nitric acid aqueous solution was added thereto. Then, the solution mixture was hydrolyzed at 50° C. for 1 hour and applied with a negative pressure to remove methanol and ethanol produced therein. The resulting product was reacted at 50° C. for 3 days. After the reaction, organosilane condensation polymerization product (weight average molecular weight=10000, polydispersity (PD)=4) was obtained.

100 g of PGMEA was added to 2.0 g of the organosilane condensation polymerization product to prepare a diluted solution. The diluted solution was mixed with 0.002 g of pyridinium p-toluene sulfonate, preparing a resist underlayer composition.

The resist underlayer composition was spin-coated on a silicon wafer and baked at 240° C. for 1 minute to provide a 1000 Å-thick resist underlayer.

EXAMPLE 4

132.4 g of phenyltrimethoxysilane, 363.82 g of methyltrimethoxysilane, and 1183.78 g of bistriethoxysilylethane were dissolved in 3920 g of PGMEA and 568.5 g of ethanol in a 10 l 4-necked flask including a mechanical agitator, a condenser, a dropping funnel, and a nitrogen gas injection tube, and 379 g of a 0.5% nitric acid aqueous solution was added thereto. Then, the solution mixture was hydrolyzed at 50° C. for 1 hour and applied with a negative pressure to remove methanol and ethanol produced therein. The resulting product was reacted at 50° C. for 3 days. After the reaction, an organosilane condensation polymerization product (weight average molecular weight=10000, polydispersity (PD)=4) was obtained.

100 g of PGMEA was added to 2.0 g of the organosilane condensation polymerization product to prepare a diluted solution. The diluted solution was mixed with 0.002 g of pyridinium p-toluene sulfonate, preparing a resist underlayer composition.

The resist underlayer composition was spin-coated on a silicon wafer and baked at 240° C. for 1 minute to provide a 1000 Å-thick resist underlayer.

EXAMPLE 5

132.4 g of phenyltrimethoxysilane, 363.82 g of methyltrimethoxysilane and 1183.78 g of bistriethoxysilylethane were dissolved in 3920 g of PGMEA and 1137.02 g of ethanol in a 10 l 4-necked flask including a mechanical agitator, a condenser, a dropping funnel, and a nitrogen gas injection tube, and 379 g of a 0.5% nitric acid aqueous solution was added thereto. Then, the solution mixture was hydrolyzed at 50° C. for 1 hour and applied with a negative pressure to remove methanol and ethanol produced therein. The resulting product was reacted at 50° C. for 3 days. After the reaction, an organosilane condensation polymerization product (weight average molecular weight=10000, polydispersity (PD)=4) was obtained.

100 g of PGMEA was added to 2.0 g of the organosilane condensation polymerization product to prepare a diluted solution. The diluted solution was mixed with 0.002 g of pyridinium p-toluene sulfonate, preparing a resist underlayer composition.

The resist underlayer composition was spin-coated on a silicon wafer and baked at 240° C. for 1 minute to provide a 1000 Å-thick resist underlayer.

EXPERIMENTAL EXAMPLE 1

The resist underlayer compositions according to Comparative Example 1 and Examples 1 to 5 were tested regarding solution stability. The resist underlayer compositions were stored at 40° C. for 30 days to measure solution state and thickness after coating.

Comparative Example 1 show poor coating properties, while the resist underlayer compositions according to Examples 1 to 5 had no thickness change (<10 Å), maintaining an initial molecular weight after a predetermined time lapse, and showing excellent storage stability.

EXPERIMENTAL EXAMPLE 2

The resist underlayers according to Comparative Example 1 and Examples 1 to were measured regarding refractive index, n, and extinction coefficient, k, using an ellipsometer (J. A. Woollam Co., Inc.).

Comparative Example 1 showed n=1.69 and k=0.00 at a 193 nm wavelength. Examples 1 and 2 showed n=1.69 and k=0.22, and Examples 3 to 5 showed n=1.69 and k=0.14.

As described above, a substituted or unsubstituted aromatic ring has an absorption spectrum in a DUV (deep UV) region and thus, may be applied as a material with high anti-reflective properties.

EXPERIMENTAL EXAMPLE 3

The resist underlayers according to Comparative Example 1 and Examples 1 to 5 were measured regarding contact angle (°). A DAS-100 (KRUSS Co.) was used. The contact angle was measured by dropping 3 μL of water on each surface of the film by 5 point and then measuring an angle of the water drop against the surface.

The resist underlayers according to Comparative Example 1 and Examples 1 and 2 had contact angles of about 85° indicating that they had relatively hydrophobic surfaces. The resist underlayers according to Example 3 to 5 had contact angles of about 72° indicating that they had relatively hydrophilic surfaces.

These results show a resist underlayer composition according to embodiments may be capable of controlling surface properties freely, and thus providing a resist underlayer having hydrophilicity or hydrophobicity.

EXPERIMENTAL EXAMPLE 4

The resist underlayers according to Comparative Example 1 and Examples 1 to 5 were bulk-dry-etched without a pattern under 90 mTorr of a pressure, 400 W/250 W of RF power, 24 sccm of $N_2$, 12 sccm of $O_2$, 500 sccm of Ar plasma condition for 15 seconds, and measured regarding thickness to calculate an etching rate (per unit time). The result is provided in the following Table 1. $N_2$ and Ar were used as flowing gas, while $O_2$ was used as a main etching gas under the experimental conditions.

TABLE 1

|  | Etching rate (Å/sec) |
|---|---|
| Comp. Example 1 | 7.80 |
| Example 1 | 7.70 |
| Example 2 | 8.26 |
| Example 3 | 6.45 |
| Example 4 | 6.48 |
| Example 5 | 6.92 |

Referring to Table 1, the resist underlayers according to Comparative Example 1 and Examples 1 to 5 had excellent etching resistance against $O_2$ plasma.

EXPERIMENTAL EXAMPLE 5

A first resist underlayer including an organic material was coated on a substrate and then the resist compositions according to Comparative Example 1 and Examples 1 to 5 were coated on the first resist underlayer to provide a second resist underlayer. On the tops, ArF photoresists were coated.

The layers stacked on the substrate were baked at 100° C. for 90 seconds. The resultant was exposed to light using ArF exposure equipment (ASML 1250 (NA 0.82)) and baked at 110° C. for 90 seconds (Post Exposure Bake). Then, development was performed using 2.38 wt % of a tetramethylammonium hydroxide (TMAH) aqueous solution, and hard-baked at 110° C. for 75 seconds. After patterning, 100 nm×100 nm line-and-space patterns were evaluated using CD-SEM. As a result, ELs (exposure latitude) according to exposure doses were 3 nm/mJ or less, and depth of focus (DoF) according to variation of the distance from a light source were 0.3 μm or less, which were levels applicable to an actual process. Using FE-SEM, cross-sections of the samples are observed and vertical-shaped cross-sections were confirmed.

Dry etching was performed on the patterned samples using $CF_x$ (x ranging from 0 to 4) plasma, and dry etching was performed using $O_2$ plasma again. Then, dry etching was performed using a $CF_x$ plasma. All the remaining organic materials were removed using oxygen ($O_2$) gas, and then the cross-sections were observed with FE-SEM. The observed pattern profiles after etching were as shown in Table 2.

TABLE 2

| Samples used for fabrication of films | Pattern profile after etching |
|---|---|
| Comparative Example 1 | Coarse (poor) |
| Example 1 | Vertical shape |
| Example 2 | Vertical shape |
| Example 3 | Vertical shape |
| Example 4 | Vertical shape |
| Example 5 | Vertical shape |

Referring to Table 2, resist underlayers obtained using the resist compositions according to Examples 1 to 5 showed fine etching profiles due to excellent etching resistance.

However, the resist layer obtained using the resist composition according to Comparative Example 1 showed a coarse vertical profile after etching.

EXPERIMENTAL EXAMPLE 6

The resist underlayers according to Comparative Example 1 and Examples 1 to 5 were examined regarding structure by using a $^{29}$Si NMR spectrometer (Varian Unity 400). In the $^{29}$Si NMR spectrum, a peak at about −65 ppm indicates a structure represented by the following Chemical Formula 3a, another peak at about −55 ppm indicates a structure represented by the following Chemical Formula 1a, and still another peak at about −45 ppm indicates a structure represented by the following Chemical Formula 2a. The peaks were calculated regarding area ratio (mol %) based on the spectrum. The result is provided in the following Table 3.

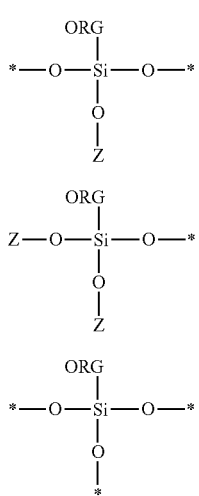

[Chemical Formula 1a]
[Chemical Formula 2a]
[Chemical Formula 3a]

In Chemical Formulae 1a to 3a,
ORG is:
a methyl group in case of Comparative Example 1,
a group selected from the group of a methyl group and a phenyl group in case of Examples 1 and 2, and
a group selected from the group of a methyl group, a phenyl group, and a triethoxysilylethyl group in case of Examples 3 to 5, and
Z is a methyl group.

TABLE 3

| Structures | Structure represented by Chemical Formula 1a (mol %) | Structure represented by Chemical Formula 2a (mol %) | Structure represented by Chemical Formula 3a (mol %) |
|---|---|---|---|
| Comp. Ex. 1 | 36 | 3 | 61 |
| Example 1 | 47 | 4 | 49 |
| Example 2 | 47 | 5 | 48 |
| Example 3 | 70 | 8 | 22 |
| Example 4 | 74 | 5 | 21 |
| Example 5 | 76 | 6 | 18 |

Referring to Table 3, the resist underlayer composition according to embodiments includes an organosilane condensation polymerization product including a structural unit represented by Chemical Formula 1 in an amount of about 40 to about 80 mol % and thus, includes more silicon, providing a resist underlayer with excellent storage stability and layer characteristic without using a silane compound. In particular, the resist underlayer composition had excellent etching resistance against gas plasma, effectively transmitting a desired pattern.

By way of summation and review, when a resist layer is thin, when a substrate to be etched is thick, when an etch depth is required to be deep, or when a particular etchant is required for a particular substrate, a resist underlayer may be used. The resist underlayer may include two layers (bilayer) having an excellent etching selectivity.

However, when a resist underlayer composition (for forming the resist underlayer) includes an organosilane condensation polymerization product, a silanol group with high reactivity may remain and, thus, deteriorate storage stability. In particular, when the resist underlayer composition is stored for a long time, the silanol group may undergo a condensation reaction and, thus, increase a molecular weight of an organosilane condensation polymerization product. If the organosilane condensation polymerization product increases the molecular weight too much, the resist underlayer composition may become a gel.

As described above, embodiments relate to a resist underlayer composition that may provide an underlayer having storage stability and etching resistance, so as to transfer an excellent pattern. Embodiments also relate to a method of fabricating a semiconductor integrated circuit device using the same.

A resist underlayer composition according to an embodiment may include more silicon, without using a silane compound, and may provide a resist underlayer with excellent storage stability and layer characteristics. In particular, the resist underlayer composition may provide excellent etching resistance against gas plasma and, thus, may be effective to transmit a desired pattern. A resist underlayer composition according to an embodiment may be adjusted to easily control a hydrophilic or a hydrophobic surface of a resist layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:
1. A resist underlayer composition, comprising:
a solvent;
an additive selected from the group of pyridinium p-toluene sulfonate, amidosulfobetain-16, ammonium(−)-camphor-10-sulfonic acid ammonium salt, ammonium formate, alkyltriethylammonium formate, pyridinium formate, tetrabutyl ammonium acetate, tetrabutyl ammonium azide, tetrabutyl ammonium benzoate, tetrabutyl ammonium bisulfate, tetrabutyl ammonium bromide, tetrabutyl ammonium chloride, tetrabutyl ammonium cyanide, tetrabutyl ammonium fluoride, tetrabutyl ammonium iodide, tetrabutyl ammonium sulfate, tetrabutyl ammonium nitrate, tetrabutyl ammonium nitrite, tetrabutyl ammonium p-toluene sulfonate, tetrabutyl ammonium phosphate, and a combination thereof; and an organosilane condensation polymerization product, the organosilane condensation polymerization product including about 40 to about 80 mol % of a structural unit represented by the following Chemical Formula 1, 1 to 20 mol % of the structural unit represented by the following Chemical Formula 2, and 10 to 50 mol % of the structural unit represented by the following Chemical Formula 3,

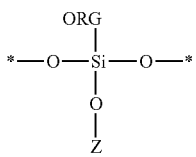

[Chemical Formula 1]

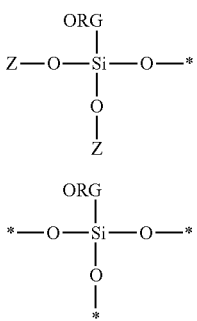

[Chemical Formula 2]

[Chemical Formula 3]

wherein, in Chemical Formulae 1-3,
ORG is independently selected from the group of:
  a C6 to C30 functional group including a substituted or unsubstituted aromatic ring,
  a C1 to C12 alkyl group, and
  —Y—{Si(OR)₃}ₐ, wherein Y is a linear or branched substituted or unsubstituted C1 to C20 alkylene group, a C1 to C20 alkylene group including, in a main chain of the alkylene group, a group selected from the group of an alkenylene group, an alkynylene group, an arylene group, a heterocyclic group, a urea group, an isocyanurate group, and a combination thereof, or a substituted or unsubstituted C6 to C30 arylene group, R is a silicon-containing group or a C1 to C6 alkyl group, and a is 1 or 2, and
Z is selected from the group of hydrogen and a C1 to C6 alkyl group.

2. The resist underlayer composition as claimed in claim 1, wherein the organosilane condensation polymerization product is produced from a compound represented by the following Chemical Formula 4 and a compound represented by the following Chemical Formula 5 under acid or base catalysis:

[R¹O]₃Si—X   [Chemical Formula 4]

[R²O]₃Si—R³   [Chemical Formula 5]

wherein, in Chemical Formulae 4 and 5,
R¹ and R² are each independently a C1 to C6 alkyl group,
R³ is a C1 to C12 alkyl group, and
X is a C6 to C30 functional group including a substituted or unsubstituted aromatic ring.

3. The resist underlayer composition as claimed in claim 1, wherein the organosilane condensation polymerization product is produced from a compound represented by the following Chemical Formula 4, a compound represented by the following Chemical Formula 5, and a compound represented by the following Chemical Formula 6 under acid or base catalysis:

[R¹O]₃Si—X   [Chemical Formula 4]

[R²O]₃Si—R³   [Chemical Formula 5]

{[R⁴O]₃Si}ₙ—Y   [Chemical Formula 6]

wherein, in Chemical Formulae 4, 5, and 6,
R¹, R², and R⁴ are each independently a C1 to C6 alkyl group,
R³ is a C1 to C12 alkyl group,
X is a C6 to C30 functional group including a substituted or unsubstituted aromatic ring, and
Y is a linear or branched substituted or unsubstituted C1 to C20 alkylene group, a C1 to C20 alkylene group including, in a main chain of the alkylene group, a group selected from the group of an alkenylene group, an alkynylene group, an arylene group, a heterocyclic group, a urea group, an isocyanurate group, and a combination thereof, or a substituted or unsubstituted C6 to C30 arylene group, and
n is 2 or 3.

4. The resist underlayer composition as claimed in claim 1, wherein:
ORG is the C6 to C30 functional group including a substituted or unsubstituted aromatic ring, and
the C6 to C30 functional group including a substituted or unsubstituted aromatic ring is represented by the following Chemical Formula 21:

*-(L)ₘ-X¹   [Chemical Formula 21]

wherein, in Chemical Formula 21,
L is a linear or branched substituted or unsubstituted C1 to C20 alkylene group, wherein one or more carbons of the alkylene group are optionally substituted with a functional group selected from the group of an ether group (—O—), a carbonyl group (—CO—), an ester group (—COO—), and an amine group (—NH—),
X¹ is selected from the group of a substituted or unsubstituted C6 to C20 aryl group, a substituted or unsubstituted C7 to C20 arylcarbonyl group, and a substituted or unsubstituted C9 to C20 chromone group, and
m is 0 or 1.

5. The resist underlayer composition as claimed in claim 1, wherein:
ORG is the C1 to C12 alkyl group.

6. The resist underlayer composition as claimed in claim 1, wherein:
ORG is the —Y—{Si(OR)₃}ₐ.

7. The resist underlayer composition as claimed in claim 1, wherein the organosilane condensation polymerization product is included in an amount of about 1 to about 50 wt % based on a total amount of the resist underlayer composition.

8. The resist underlayer composition as claimed in claim 1, further comprising an additive selected from the group of a cross-linking agent, a radical stabilizer, a surfactant, and a combination thereof.

9. A method of manufacturing a semiconductor integrated circuit device, the method comprising:
providing a material layer on a substrate;
forming a first resist underlayer on the material layer;
coating the resist underlayer composition as claimed in claim 1 on the first resist underlayer to form a second resist underlayer;

forming a radiation-sensitive imaging layer on the second underlayer;

patternwise exposing the radiation-sensitive imaging layer to radiation to form a pattern of radiation-exposed regions in the imaging layer;

selectively removing portions of the radiation-sensitive imaging layer and the second resist underlayer to expose portions of the first resist underlayer;

selectively removing portions of the patterned second resist underlayer and portions of the first resist underlayer to expose portions of the material layer; and etching the exposed portions of the material layer to pattern the material layer.

10. The method as claimed in claim 9, further comprising, between the processes of forming the second resist underlayer and forming the radiation-sensitive imaging layer, forming an anti-reflection coating.

11. A semiconductor integrated circuit device manufactured using the method as claimed in claim 9.

* * * * *